(12) United States Patent
Kamikawa et al.

(10) Patent No.: US 7,960,720 B2
(45) Date of Patent: Jun. 14, 2011

(54) TRANSISTOR, TRANSISTOR CIRCUIT, ELECTROOPTICAL DEVICE AND ELECTRONIC APPARATUS

(75) Inventors: Taketomi Kamikawa, Shiojiri (JP); Masamitsu Inoue, Suwa (JP)

(73) Assignees: Seiko Epson Corporation, Tokyo (JP); Shinshu University, National University Corporation, Matsumoto-Shi (JP)

( * ) Notice: Subject to any disclaimer, the term of this patent is extended or adjusted under 35 U.S.C. 154(b) by 434 days.

(21) Appl. No.: 12/017,782

(22) Filed: Jan. 22, 2008

(65) Prior Publication Data
US 2008/0173866 A1 Jul. 24, 2008

(30) Foreign Application Priority Data
Jan. 24, 2007 (JP) .................. 2007-014322

(51) Int. Cl.
*H01L 51/00* (2006.01)
(52) U.S. Cl. .................. 257/40; 257/E51.006
(58) Field of Classification Search .......... 257/E21.637, 257/E21.623, E51.006, 40
See application file for complete search history.

(56) References Cited

U.S. PATENT DOCUMENTS

| | | | |
|---|---|---|---|
| 7,335,919 B2 * | 2/2008 | Koo et al. .................. 257/72 |
| 7,482,623 B2 | 1/2009 | Nishikawa et al. | |
| 7,514,326 B2 * | 4/2009 | Han .................. 438/283 |
| 2004/0029310 A1 * | 2/2004 | Bernds et al. .................. 438/99 |
| 2005/0208400 A1 * | 9/2005 | Nishikawa et al. .......... 430/57.8 |
| 2005/0218798 A1 * | 10/2005 | Chang .................. 313/506 |
| 2006/0220056 A1 * | 10/2006 | Lee .................. 257/100 |
| 2007/0109457 A1 * | 5/2007 | Song et al. .................. 349/44 |

FOREIGN PATENT DOCUMENTS

| | | |
|---|---|---|
| JP | A-2004-507096 | 3/2004 |
| JP | A-2005-079549 | 3/2005 |
| JP | A-2005-166713 | 6/2005 |
| JP | A-2005-268721 | 9/2005 |
| JP | A-2007-227595 | 9/2007 |

OTHER PUBLICATIONS

Li et al., "Photolithographically defined polythiophene organic thin-film transistors," J. Vac. Sci. Tech. A., vol. 24, No. 3, pp. 657-662, 2006.
Koo et al., "Pentacene Thin-Film Transistors and Inverters with Dual-Gate Structure," Electrochemical and Solid-State Letters, vol. 9, No. 11, pp. G320-G322, 2006.

* cited by examiner

*Primary Examiner* — Quoc D Hoang
(74) *Attorney, Agent, or Firm* — Oliff & Berridge PLC

(57) ABSTRACT

A transistor including a first gate electrode, a second gate electrode, a first gate insulating layer disposed between the first gate electrode and the second gate electrode, a first interlayer disposed between the first gate insulating layer and the second gate electrode and containing a first organic material, an organic semiconductor layer disposed between the first interlayer and the second gate electrode, a second gate insulating layer disposed between the organic semiconductor layer and the second gate electrode, and a source electrode and a drain electrode disposed between the first interlayer and the second gate insulating layer and injecting carriers into the organic semiconductor layer, wherein an ambipolar property is imparted to a part of the organic semiconductor layer that contacts with the first interlayer under an action of the first interlayer.

13 Claims, 7 Drawing Sheets

ENLARGED VIEW OF ENCLOSED AREA "A"

TRANSISTOR, TRANSISTOR CIRCUIT, ELECTROOPTICAL DEVICE AND ELECTRONIC APPARATUS

The entire disclosure of Japanese Patent Application No. 2007-014322, filed Jan. 24, 2007 is expressly incorporated by reference herein.

BACKGROUND OF THE INVENTION

1. Technical Field

Several aspects of the present invention relates to a transistor, a transistor circuit, an electrooptical device and an electronic apparatus.

2. Related Art

In recent years, development of a thin film transistor using an organic material (organic semiconductor material) that has an electric conducting property like semiconductor has been studied. Such thin film transistor has advantages such that it can be suitably adopted for thinner and lighter electronic devices, it has flexibility and its material cost is inexpensive. For these advantages, the thin film transistor made of an organic material is expected to be used as a switching element for a flexible display or the like.

Two types of structure have been proposed for such thin film transistor. One is a top gate structure in which a source electrode, a drain electrode and an organic semiconductor layer are formed on a substrate and a gate insulating layer and a gate electrode are sequentially formed on top of them. The other is a bottom gate structure in which a gate electrode and a gate insulating layer are firstly formed in this order on a substrate and then a source electrode, a drain electrode and an organic semiconductor layer are formed on top of them.

An organic semiconductor has a disadvantage that it has a small on-state current compared with that of an inorganic semiconductor. JP-A-2005-079549 is an example of related art. The example proposes an organic thin film transistor having two gate electrodes. In the organic thin film transistor according to the example, two channels are formed because the two gate electrodes are provided there and it is possible to control a larger current compared to the case where only a single gate electrode is provided.

However, the two channels formed in the organic thin film transistor according to the example has the same carrier polarity so that the organic thin film transistor has a small freedom when it comes to designing a circuit in which organic thin film transistors are combined.

Moreover, in the case of an organic semiconductor, it is difficult to control its threshold voltage and channel polarity by controlling impurity doping which is normally performed in the manufacturing process of a transistor made of amorphous silicon or polysilicon. For this reason, it is not easy to overcome the above-mentioned disadvantage.

SUMMARY

An advantage of the present invention is to provide a transistor having an organic semiconductor layer that includes two channel parts whose polarities are different each other and with which it is possible to increase flexibility in circuit design. Another advantage of the invention is to provided a high-performance and small-sized transistor having such transistor, a high-performance electrooptical device and an electronic apparatus thereof.

A transistor according to a first aspect of the invention includes a first gate electrode, a second gate electrode, a first gate insulating layer disposed between the first gate electrode and the second gate electrode, a first interlayer disposed between the first gate insulating layer and the second gate electrode and containing a first organic material, an organic semiconductor layer disposed between the first interlayer and the second gate electrode, a second gate insulating layer disposed between the organic semiconductor layer and the second gate electrode, and a source electrode and a drain electrode disposed between the first interlayer and the second gate insulating layer and injecting carriers into the organic semiconductor layer, wherein an ambipolar property is imparted to a part, which contacts with the first interlayer, of the organic semiconductor layer under an action of the first interlayer. In this way, it is possible to obtain the transistor having the organic semiconductor layer that includes two channel regions where carrier polarities differ. Moreover, with this transistor, it is possible to expand the freedom in the circuit design.

A transistor according to a second aspect of the invention includes a first gate electrode, a second gate electrode, a first gate insulating layer disposed between the first gate electrode and the second gate electrode, a first interlayer disposed between the first gate insulating layer and the second gate electrode and containing a first organic material, an organic semiconductor layer disposed between the first interlayer and the second gate electrode, a second interlayer disposed between the organic semiconductor layer and the second gate electrode and containing a second organic material, a second gate insulating layer disposed between the second interlayer and the second gate electrode, and a source electrode and a drain electrode disposed between the first interlayer and the second interlayer and injecting carriers into the organic semiconductor layer, wherein an ambipolar property is imparted to a part, contacts with the first interlayer and the second interlayer, of the organic semiconductor layer under an action of the first interlayer and a second interlayer. In this way, it is possible to obtain the transistor having the organic semiconductor layer that includes two channel regions where carrier polarities differ. Moreover, with this transistor, it is possible to expand the freedom in the circuit design.

It is preferable that the first interlayer and the second interlayer differ in condition. In this way the ambipolar properties of the parts of the organic semiconductor layer that contact with the two interlayers can be made different each other. It is also preferable that the first interlayer be made of a different material from a material forming the second interlayer. In this way it is possible to reliably adjust the ambipolar properties of the parts of the organic semiconductor layer that contact with the two interlayers.

It is preferable that an average thickness of the first interlayer and the second interlayer be respectively in a range of 5-200 nm. In this way, it is possible to reliably apply an electric field generated by the first gate electrode to the organic semiconductor layer while the above-mentioned affects by the first interlayer are assuredly exerted. Consequently the ambipolar property is securely given to the organic semiconductor layer.

It is also preferable that the first organic material at least include one selected from the group including benzo-cyclo-butene (BCB), octadecyl-trichloro-silane (OTS) and hexa-methyl-disilazane (HMDS). In this way, adverse affects including ion diffusion to the organic semiconductor layer can be prevented and an excellent ambipolar property can be imparted.

It is preferable that a part of the organic semiconductor layer that contacts with the first gate insulating layer side differ from a part of the organic semiconductor layer that contacts with the second gate insulating layer side in carrier polarity. In this way, it is possible to expand the freedom in the circuit design where the transistors are combined. Moreover, it is possible to develop n-type semiconductor characteristic in a part of the organic semiconductor layer by using a p-type organic semiconductor material that has a relatively abundant variety. The n-type semiconductor has an advantage that its carrier mobility is higher than that of the p-type semiconductor thus it is possible to realize the transistor and a circuit that is capable of a high-speed operation.

It is also preferable that the source electrode and the drain electrode be disposed in the organic semiconductor layer and have a multilayered structure respectively. In this way it is possible to adequately select the material, which has a high carrier injection efficiency, for each layer in the layered structure according to the polarity of the carrier injected in to the organic semiconductor layer. Consequently the carrier injection efficiency into the electrodes can be increased and the transistor characteristics can be improved.

It is preferable that a layer of the multilayered structure that is situated closest to a part of the organic semiconductor layer where carrier polarity is positive be made of a material whose work function is deeper than materials forming other layers of the multilayered structure. In this way holes can be efficiently injected into the part of the organic semiconductor layer where the carrier polarity is positive.

It is also preferable that a layer of the multilayered structure that is situated closest to a part of the organic semiconductor layer where carrier polarity is negative be made of a material whose work function is shallower than materials forming other layers of the multilayered structure. In this way electrons can be efficiently injected into the part of the organic semiconductor layer where the carrier polarity is negative. It is preferable that the organic semiconductor layer be formed of a conjugate system high-molecule material because the conjugate system high molecule material has a unique distribution of electron cloud and has a very high migratory aptitude of carrier.

A transistor circuit according to a third aspect of the invention includes the above-described transistor. In this way it is possible to realize a high-performance and small-sized transistor circuit.

An electrooptical device according to a fourth aspect of the invention includes the above-mentioned transistor circuit. In this way a high-performance electrooptical device can be obtained.

An electronic apparatus according to a fifth aspect of the invention includes the above-mentioned electrooptical device. In this way a high-performance electronic apparatus can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention relating to a transistor, a transistor circuit, an electrooptical device and an electronic apparatus will be described.

I. Transistor

First Embodiment

Figure 1A:
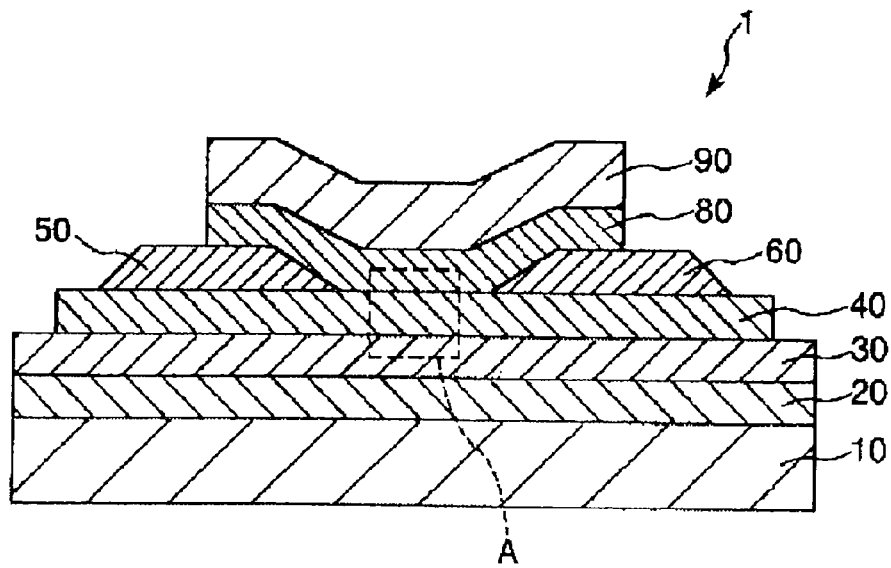
FIG. 1A is a longitudinal sectional view of a transistor according to a first embodiment of the invention schematically showing its structure.
Figure 1B:
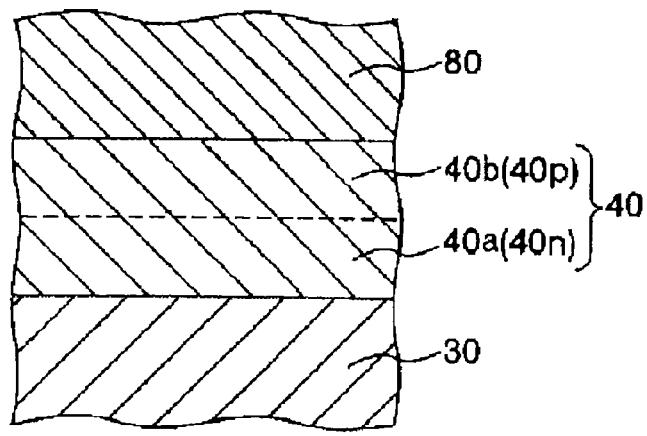
FIG. 1B is an enlarged view of the transistor shown in FIG. 1A.

A transistor according to a first embodiment of the invention is described. FIG. 1A is a longitudinal sectional view of a transistor according to the first embodiment of the invention schematically showing its structure. FIG. 1B is an enlarged view of the enclosed area "A" in FIG. 1A. FIGS. 2A-2D and FIGS. 3E and 3F are longitudinal sectional views illustrating a method for manufacturing the transistor shown in FIG. 1.

Referring to FIG. 1, a transistor 1 (according to the embodiment of the invention) is a transistor having an organic semiconductor layer and two gate electrodes. The transistor 1 includes a substrate 10 that also serves as a first gate electrode, a first gate insulating layer 20 provided on the substrate 10, a first interlayer 30, an organic semiconductor layer 40 provided on the first interlayer 30, a source electrode 50 and a drain electrode 60 that are separately formed on the organic semiconductor layer 40, a second insulating layer 80 formed on the electrodes 50, 60 and the organic semiconductor layer 40, and a second gate electrode 90 provided on the second insulating layer 80. Description of these parts of the transistor 1 will be hereunder given.

The substrate 10 not only supports the layers (parts) of the transistor 1 but also has conductivity and serves as a first gate electrode. N-type or P-type silicon substrates, compound semiconductor substrates such as a gallium arsenide substrate, metal substrates or the like can be adopted as the substrate 10. Though the substrate 10 according to the embodiment serves as the substrate to support the parts of the transistor and as the first gate electrode at the same time, these functions can be realized by individual components.

For example, the substrate 10 can be replaced by an insulating substrate and an conductive layer which has a conductive property and is formed on the insulating substrate. In this case, a glass substrate, a plastic substrate (resin substrate) made of polyethylene terephthalate (PET), polyethylene naphthalate (PEN), polyethersulfone (PES), aromatic polyester (liquid crystal polymer), polyimide (PI) or the like, other resins such as polyethylene resin, polystyrene resin, polyvinyl chloride resin, polycarbonate (PC), and the like can be used as the insulating substrate.

As for the conductive layer, any material as long as it has a conductive property can be adopted to form the conductive layer. For example, metal materials such as Au, Ag, Cu, Pt, Ni, Cr, Ti, Ta, Al and Ca or alloys thereof, conductive organic materials, polysilicon or the like can be named. Though there is no particular limit for an average thickness of the substrate 10, however about 0.5-500 μm is preferable and about 10-300 μm is more preferable.

The first gate insulating layer 20 is provided on the above-described substrate 10. The first gate insulating layer 20 is a layer that insulates the first gate electrode (the substrate 10) from the hereinafter described source electrode 50 and drain electrode 60. Any hitherto known insulating materials can be adopted to form the first gate insulating layer 20. Both organic and inorganic material can be used to form the first gate insulating layer 20.

Such organic material includes for example polymethyl methacrylate, polyvinyl phenol, polyimide, polystyrene, polyvinyl alcohol, polyvinyl acetate, polyvinyl phenol and the like, and one or more combined thereof. While the inorganic material includes metal oxides such as silica, silicon nitride, aluminum oxide and tantalum oxide, metal composite oxides such as barium strontium titanate and lead zirconium titanate and the like, and one or more combined thereof.

An average thickness of the first gate insulating layer 20 is not particularly limited. However it is preferable that the thickness is in a range of 10-5000, more preferably 100-2000 nm. Making the thickness of the first gate insulating layer 20 in this range, the layer can securely insulate the source electrode 50 and the drain electrode 60 from the first gate electrode (the substrate 10), and it is possible to lower the operating voltage of the transistor 1. The first gate insulating layer 20 can have either a single layer structure or a layered structure of more than one layer.

The first interlayer 30 is disposed on the first gate insulating layer 20. The first interlayer 30 is made of an organic material. When the first interlayer 30 is made of an organic material, adverse affects including ion diffusion to the organic semiconductor layer 40 can be prevented, in addition, an ambipolar property is securely imparted. The organic material forming the first interlayer is not particularly limited. However ones containing benzo-cyclo-butene (BCB), octadecyl-trichloro-silane (OTS) or hexa-methyl-di-silazane (HMDS) are preferable. These organic materials can prevent the adverse affects including ion diffusion to the organic semiconductor layer 40 and also can impart a fine ambipolar property to the organic semiconductor layer 40.

Though an average thickness of the first interlayer 30 is not particularly limited, a range of 5-200 nm is preferable, and more preferably 10-150 nm. By setting the thickness of the first interlayer 30 within the above-mentioned range, it is possible to reliably apply an electric field generated by the first gate electrode to the organic semiconductor layer 40 while the above-mentioned affects by the first interlayer 30 are assuredly exerted. The detailed description of the first interlayer 30 will be further given later in the description.

The organic semiconductor layer 40 is provided on the first interlayer 30. The organic semiconductor layer 40 is mainly made of an organic semiconductor material (organic material that shows an electronic conducting property like semiconductor). Such organic semiconductor material includes low-molecular organic semiconductor materials such as naphthalene, anthracene, tetracene, pentacene, hexacene, perylene, hydrazone, triphenylmethane, diphenylmethane, stilbene, aryl-vinyl, pyrazoline, triphenylamine, triarylamine, oligothiophene, phthalocyanine and derivatives thereof, high-molecular organic semiconductor materials (conjugate system polymer materials) such as poly-N-vinyl carbazole, polyvinylpyrene, polyvinyl-anthracene, polythiophene, polyalkyltiophene, polyhexyltiophene, poly (p-phenylene vinylene), polythienylene vinylene, polyarylamine, pyrene formaldehyde resin, ethylcarbazole formaldehyde resin, fuluorene-bithiophene copolymer, fuluorene-allylamine copolymer and derivatives thereof; various metal complexes including phthalocyanine, fullerenes such as $C_{60}$, $C_{82}$ and $C_{82}$ that includes dysprosium (Dy), and carbon nanotubes. Either one of the above-mentioned materials or any combination thereof can be adopted as the organic semiconductor material. The high-molecular organic semiconductor materials (conjugate system high-polymer materials) are particularly preferable because the conjugate system high-polymer materials have a unique distribution of electron cloud and have a very high migratory aptitude of carrier.

The high-molecular organic semiconductor materials can be made into a film by a simple method and can be easily oriented. It is preferable that the material containing at least one of fuluorene-bithiophene copolymer, fuluorene-allylamine copolymer, polyarylamine or derivatives thereof be used. Among the above-named high-molecular organic semiconductor materials (conjugate system high-polymer materials), these materials have advantages that they are stable and difficult to be oxidized in the air. Where the organic semiconductor layer 40 is mainly made of such high-molecular organic semiconductor material, it is possible to fabricate a thin and light-weight device and the layer has a fine flexibility. Therefore the semiconductor layer is appropriate for thin film transistors which are used as switching elements or the like in a flexible display.

An average thickness of the organic semiconductor layer 40 is preferably in a range of 1-200 nm, more preferably 10-100 nm. The organic semiconductor layer 40 can be formed from more than one type of the organic semiconductor materials. However it is preferable that the layer is made of a single organic semiconductor material because the manufacturing process of the organic semiconductor layer 40 can be simplified and the transistor can be easily fabricated at a low cost.

The source electrode 50 and the drain electrode 60 are formed on the organic semiconductor layer 40 in a direction along a channel length "L" with a predetermined distance therebetween. The source electrode 50 and the drain electrode 60 are made of for example metal material such as Pd, Pt, Au, W, Ta, Mo, Al, Cr, Ti, Cu and alloys thereof. The materials that form these electrodes are appropriately selected according to the type of carrier that are transferred through the channel region. For example, in the case of a p-channel thin film transistor in which holes are transferred through the channel region, Pd, Pt, Au, Ni, Cu or alloys thereof is preferably adopted because work function of these metals is relatively high.

In addition to the above-mentioned metal materials, conductive oxides such as ITO, FTO, ATO and $SnO_2$; carbon materials such as carbon black, carbon nanotube and fullerene; conductive polymer materials such as polyacetylene, polypyrrole, polythiophenes including poly-ethylenedioxythiophene (PEDOT), polyaniline, poly (p-phenylene), poly (p-phenylene vinylene), polyfluorene, polycarbazole, polysilane and derivatives thereof can also be used to form the source electrode 50 and the drain electrode 60. Moreover, one or more than one of the above-mentioned material combined can be also used. When these conductive polymer materials are adopted, ferric chloride, iodine, inorganic acid, organic acid, polymer such as polysthylene-sulfonicacid or the like is generally doped into a conductive polymer material in order to impart a conducting property to the material.

Average thicknesses of the source electrode 50 and the drain electrode 60 are not particularly limited. However, about 30-300 nm is preferable and 50-150 nm is more preferable. The distance (a separation distance) between the source electrode 50 and the drain electrode 60 or the channel length "L" is preferably in a range of 2-30 μm, more preferably 5-20 μm. If the channel length "L" is smaller than the lower limit of the range, error in the channel length "L" among obtained transistors 1 can be made apparent and it will cause variation in characteristics (transistor characteristics) of the obtained transistors. If the channel length "L" is larger than the upper limit of the range, an absolute value of the threshold voltage becomes large and the drain current becomes small, and this can make the characteristics of the transistor 1 unsatisfied.

A channel width, which is a length in a direction orthogonal to the channel length "L", is preferably set in a range of 0.1-5 mm, more preferably 0.5-3 mm. If the channel width is smaller than the lower limit of the range, the drain current becomes too small, which could make the characteristics of the transistor 1 unsatisfied. If the channel width is larger than the upper limit of the range, the size of the transistor 1 becomes large. Accordingly a parasitic capacitance, a leak current (a gate leak current) to the first gate electrode (the substrate 10) through the first gate insulating layer 20, and a leak current to the second gate electrode 90 through the hereunder-described second gate insulating layer 80 could be increased.

The second gate insulating layer 80 is provided so as to cover a part of the source electrode 50 and the drain electrode 60 and therebetween on the organic semiconductor layer 40. The second gate insulating layer 80 insulates the source electrode 50 and the drain electrode 60 from the second gate electrode 90. Any insulating materials can be used to form the second gate insulating layer 80. For example, the same material as the one used to form the first gate insulating layer 20 can be adopted. Though an average thickness of the second gate insulating layer 80 is not particularly limited, it is preferably set in a range of 10-5000 nm, more preferably 100-2000 nm. By setting the thickness of the second gate insulating layer 80 in the above-mentioned range, it is possible to securely insulate the source electrode 50 and the drain electrode 60 from the second gate electrode 90 as well as to reduce the operating voltage of the transistor 1. The second gate insulating layer 80 can have either a single layer structure or multi-layered structure.

On top of the second gate insulating layer 80, the second gate electrode 90 that is electrically independent from the first gate electrode (the substrate 10) is provided. The same materials as the ones for the source electrode 50 and the drain electrode 60 named above can be used to form the second gate electrode 90. An average thickness of the second gate electrode 90 is not particularly limited, but it is preferably set in a range of 0.1-5000 nm, more preferably 1-5000 nm, and most preferably 10-5000 nm.

In the transistor 1, the amount of the current flowing between the source electrode 50 and the drain electrode 60 is controlled by changing the voltages (electric potentials) applied to the first gate electrode (the substrate 10) and to the second gate electrode 90. More specifically, when the transistor is in OFF state where no voltage is applied to the first gate electrode and the second gate electrode 90, only a very small amount of current flows even if an voltage is applied between the source electrode 50 and the drain electrode 60 because carriers hardly exist in the organic semiconductor layer 40. When the transistor is in ON state where an voltage is applied to the first gate electrode or to the second gate electrode 90, mobile electric charges (carriers) are induced in the areas of the organic semiconductor layer 40 where faces the first gate insulating layer 20 or where faces the second gate insulating layer 80, and a channel region is formed.

When a voltage is applied between the source electrode 50 and the drain electrode 60 at this point, a current flows through the channel region.

In the transistor 1 according to the embodiment, the first interlayer 30 is disposed between the first gate insulating layer 20 and the organic semiconductor layer 40 as described before. The first interlayer 30 imparts an ambipolar property to a part of the organic semiconductor layer 40 that contacts with the first interlayer 30 in other words a lower part 40a of the organic semiconductor layer 40 as shown in FIG. 1.

The "ambipolar property" is a term mainly used in a field of organic semiconductor and means a property that p-type semiconductor characteristics are shown when holes are injected as the carriers whereas n-type semiconductor characteristics are shown when electrons are injected as the carriers. In this description, for example where the organic semiconductor layer 40 innately has the ambipolar property but the property is not expressed when the semiconductor is used under a normal condition, if the ambipolar property is developed under the normal usage condition of the organic semiconductor layer 40 by providing the first interlayer 30, it also means that the ambipolar property is given to the semiconductor.

When the transistor 1 has this first interlayer 30, the organic semiconductor layer 40 includes a part 40b where shows an original property of the semiconductor material and a part 40a where shows the ambipolar property. It has not been explained how the above-mentioned action or effect by the first interlayer 30 occurs. It is only inferred that some electric property of the first interlayer 30 affects the mobility of the carriers in the organic semiconductor layer 40.

As for the part 40a that shows the ambipolar property, it is possible to control the property between that of the p-type semiconductor and the n-type semiconductor selectively and to adjust the carrier mobility and the threshold voltage by selecting the material forming the first interlayer 30. For example if the material of the first interlayer 30 is selected such that the carrier polarity of the part 40a which contacts with the first inter layer 30 (the part facing the first gate insulating layer 20) is made different from the carrier characteristic of the semiconductor material forming the organic semiconductor layer 40, the organic semiconductor layer 40 has a part 40p that shows a p-type semiconductor characteristic and a part 40n that shows a n-type semiconductor characteristic as shown in FIG. 1B. The transistor 1 having such organic semiconductor layer 40 includes two channel regions having different polarities in carrier so that it is possible to expand the freedom in the circuit design where the transistors 1 are combined.

Moreover, it is possible to develop the n-type semiconductor characteristic in a part of the organic semiconductor layer 40 by using a p-type organic semiconductor material that has a relatively abundant variety. In other words, it is possible to virtually obtain an n-type semiconductor without using a n-type organic semiconductor material whose variety is relatively small. The n-type semiconductor has an advantage that its carrier mobility is higher than that of the p-type semiconductor. Therefore, by using the p-type organic semiconductor materials that can be procured easily, it is possible to realize the transistor 1, a circuit or the like that is capable of a high-speed operation.

In this embodiment, a case where fuluorene-bithiophene copolymer (F8T2) which is a p-type semiconductor is adopted to form the organic semiconductor layer 40 and benzo-cyclo-butene which is a n-type semiconductor is adopted to form the first interlayer 30 is now described as an example. In this case the characteristics of the n-type semiconductor appear at the part of the organic semiconductor layer 40 that contacts with the first interlayer 30. In this way the p-type semiconductor and the n-type semiconductor exist together in the organic semiconductor layer 40.

Referring to FIG. 1, the transistor 1 further has the first gate electrode (the substrate 10) and the second gate electrode 90 that are electrically independent each other. Thereby it is possible to control the carrier migration in the part 40p which has the properties of a p-type semiconductor and to control the carrier migration in the part 40 which has the properties of a n-type semiconductor. These controls are carried out independently each other. In other words, the transistor 1 has the two channel regions which are independently and identically controllable and whose carrier polarity is different each other.

The transistor 1 can have two channel regions whose carrier mobility is different each other by setting an appropriate condition of the first interlayer 30 as described above. Moreover, such transistor 1 can be easily manufactured at a low cost. Consequently these advantageous effects of the invention can contribute to realize a high-performance and small-sized circuit in which the transistors 1 are incorporated and manufactured at a reduced cost. More specifically, where a circuit requiring a high-speed switching such as a memory circuit is to be controlled, a channel region having a high operation speed is used among transistors that have different operation performances. Whereas a circuit that does not require the high-speed switching is controlled, a channel region having a slow operation speed is used.

Moreover more than one gate electrode is provided according to the embodiment, thereby it is possible to prevent the increase of the heat generated by the current flowing through the gate electrodes, and at the same time it is possible to increase the amount of the current which run through the entire gate electrodes. Through this way it is possible to improve the transistor characteristics of the transistor 1. If it is not necessary to increase the amount of the current, the amount of the current per gate electrode can be decreased. In this way it is possible to reduce the heat generated at the gate electrodes. Furthermore, referring to FIG. 1, in the transistor 1, the first gate electrode (the substrate 10) is arranged so as to oppose the second gate electrode 90 with the organic semiconductor layer 40 interposed therebetween. This works as an advantage that the independent control of the two channel regions in the organic semiconductor layer 40 can be made easier.

A method for manufacturing such transistor 1 will be now described. A method for manufacturing the transistor 1 shown in FIG. 1 includes a step in which the first gate insulating layer 20 is formed on the substrate 10, a step in which the first interlayer 30 is formed on the first gate insulating layer 20, a step in which the organic semiconductor layer 40 is formed on the first interlayer 30, and the source electrode 50 and the drain electrode 60 are formed on the organic semiconductor layer 40, a step in which the second gate insulating layer 80 is formed so as to cover a part of the source electrode 50 and the drain electrode 60 and therebetween on the organic semiconductor layer 40, and a step in which the second gate electrode 90 is formed on the second gate insulating layer 80. Each of the above-mentioned steps is sequentially hereunder described in detail.

Step 1: The first gate insulating layer 20 is formed on the substrate 10 (see FIG. 2A). Where the substrate 10 is for example a silicon substrate, the first gate insulating layer 20 made of silica ($SiO_2$) can be formed on the substrate 10 by a thermal oxidation method. Where the first gate insulating layer 20 is made of an inorganic material, the first gate insulating layer 20 can be formed by a chemical vapor deposition (CVD) method, a spin-on glass (SOG) method or the like. Where polysilazane is used as material, a silica film or a silicon nitride film can be formed as the first gate insulating layer 20 through a wet-process.

Whereas the first gate insulating layer 20 is made of an organic polymer material, the first gate insulating layer 20 can be formed by applying (supplying) a solution of the organic polymer material or its precursor onto the substrate 10 and performing a necessary post-treatment process (for example, heating, irradiation of infrared-rays, ultrasonic irradiation or the like). The solution of the organic polymer material or its precursor can be applied (supplied) onto the substrate 10 by for example an application method such as a spin coating method and a dip coating method, a printing method such as an ink-jet printing method (a droplet discharge method) and a screen printing method, or the like.

Figure 2A:
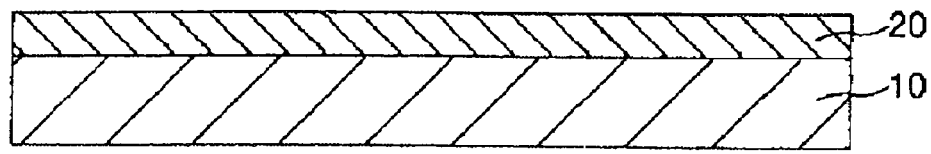
FIGS. 2A-2D are longitudinal sectional views illustrating a method for manufacturing the transistor shown in FIG. 1.
Figure 2B:
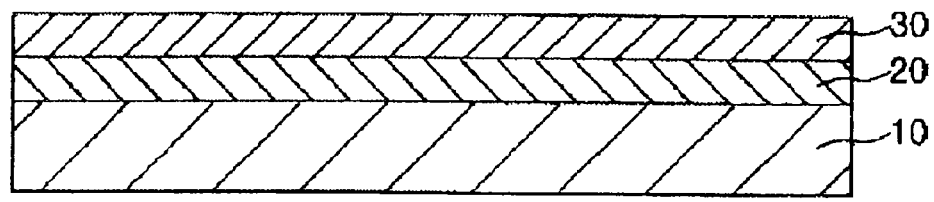

Step 2: Referring to FIG. 2B, the first interlayer 30 is formed on the first gate insulating layer 20. The first interlayer 30 can be formed by for example a chemical vapor deposition (CVD) method such as a plasma CVD method, a heat CVD method and a laser CVD method, a gas-phase film forming method such as a vacuum deposition method or the like. Alternatively, the first interlayer 30 can be formed by a liquid-phase film forming method such that a solution of the material or its precursor is applied onto the first gate insulating layer 20 and a necessary post-treatment process is performed to the applied film. A patterning and the formation of the first interlayer 30 can be simultaneously performed by deposition (a mask deposition method) using a mask that has an opening at the position corresponding to the first inter layer 30. As described above, the first interlayer 30 imparts the ambipolar property to a part of the organic semiconductor layer 40 that contacts with the first interlayer 30. Thereby it is possible to form two channel region with different polarities in carrier in the organic semiconductor layer 40 which is made of a single organic semiconductor material.

Figure 2C:
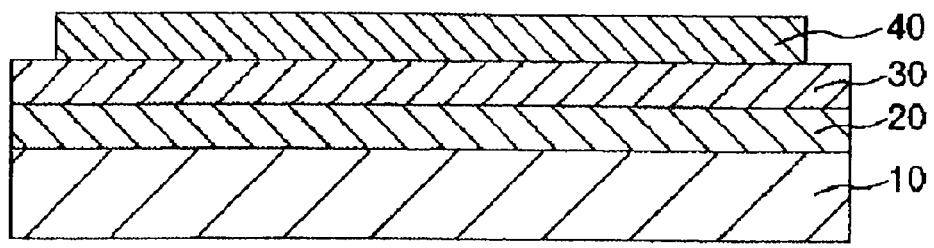

Step 3: Referring to FIG. 2C, the organic semiconductor layer 40 is formed on the first interlayer 30. Where the organic semiconductor layer 40 is made of an organic polymer material, the organic semiconductor layer 40 can be formed by the above-mentioned liquid-phase film forming method such that a solution of the organic polymer material or its precursor onto the first interlayer 30 is provided and then a necessary post-treatment process is performed if required. Where the organic semiconductor layer 40 is made of an organic low-molecule material, the organic semiconductor layer 40 can be formed by a gas-phase film forming method such as a vacuum deposition method and a molecular beam epitaxy (MBE) method or the like.

Figure 2D:
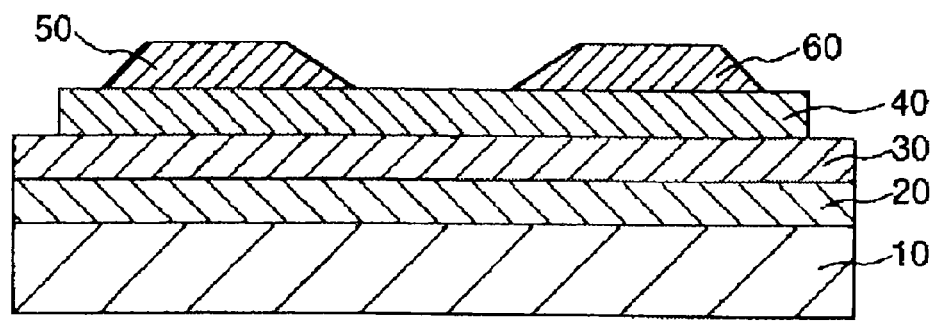

Step 4: Referring to FIG. 2D, the source electrode 50 and the drain electrode 60 are formed on the organic semiconductor layer 40. The source electrode 50 and the drain electrode 60 can be formed by the above-mentioned mask deposition method.

Figure 3E:
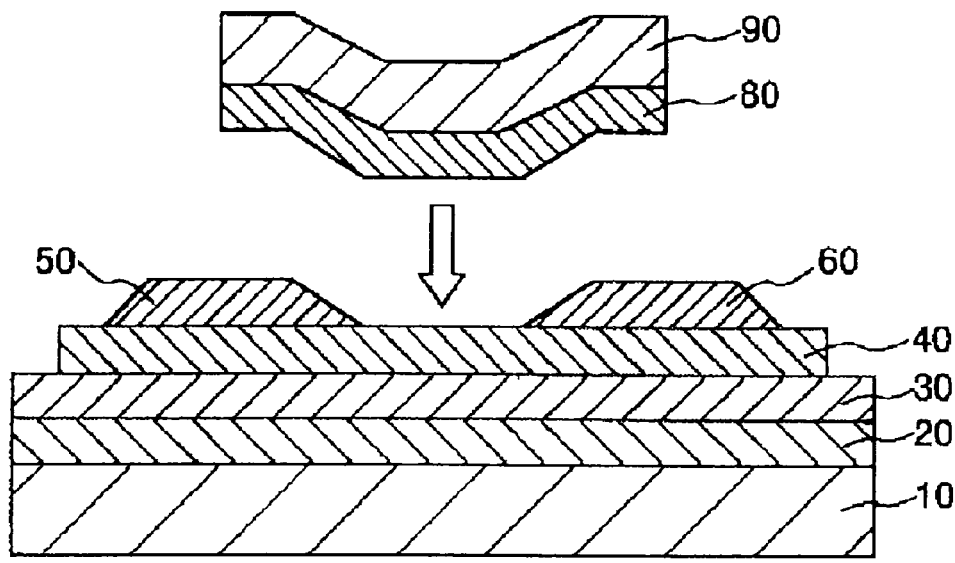
FIGS. 3E and 3F are longitudinal sectional views illustrating the method for manufacturing the transistor shown in FIG. 1.

Step 5: Referring to FIG. 3E, the second gate insulating layer 80 is formed so as to cover a part of the organic semiconductor layer 40, the source electrode 50 and the drain electrode 60. In this embodiment, the second gate insulating layer 80 is formed on the second gate electrode 90 (on the lower face of the second gate electrode 90 in FIG. 3E). The second gate insulating layer 80 can be formed by the same way as the above-described first gate insulating layer 20.

Figure 3F:
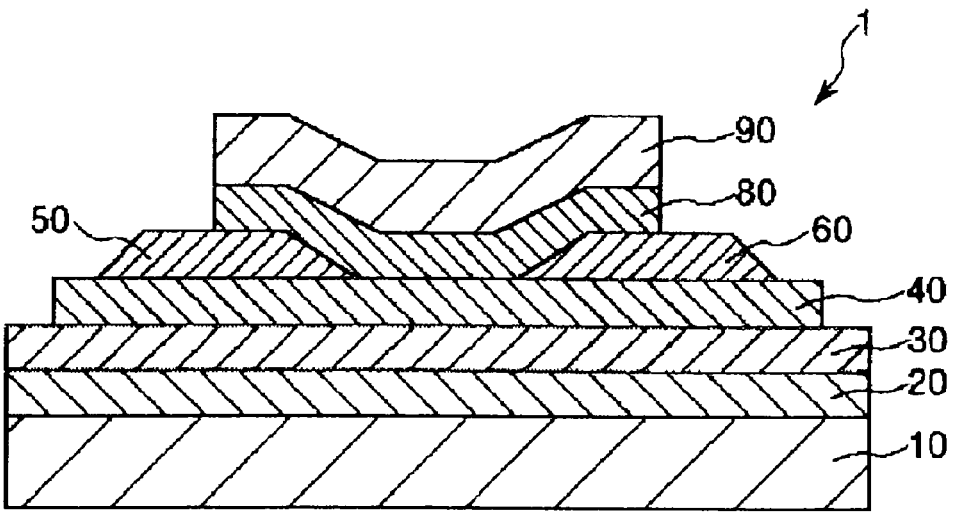

Step 6: Referring to FIG. 3F, the second gate electrode on which the second gate insulating layer 80 is formed is then jointed to the intermediate fabricated through the above-described step 4 such that the second gate insulating layer 80 contacts with each upper face of the organic semiconductor layer 40, the source electrode 50 and the drain electrode 60. Any methods can be adopted for the jointing. For example, adhesive or the like can be applied onto the interfaces so as to joint them, or the second gate insulating layer 80 can be pressed and bonded with the organic semiconductor layer 40, the source electrode 50 and the drain electrode 60. Through above-described processes, the transistor 1 shown in FIG. 1 can be obtained.

Second Embodiment

Figure 4:
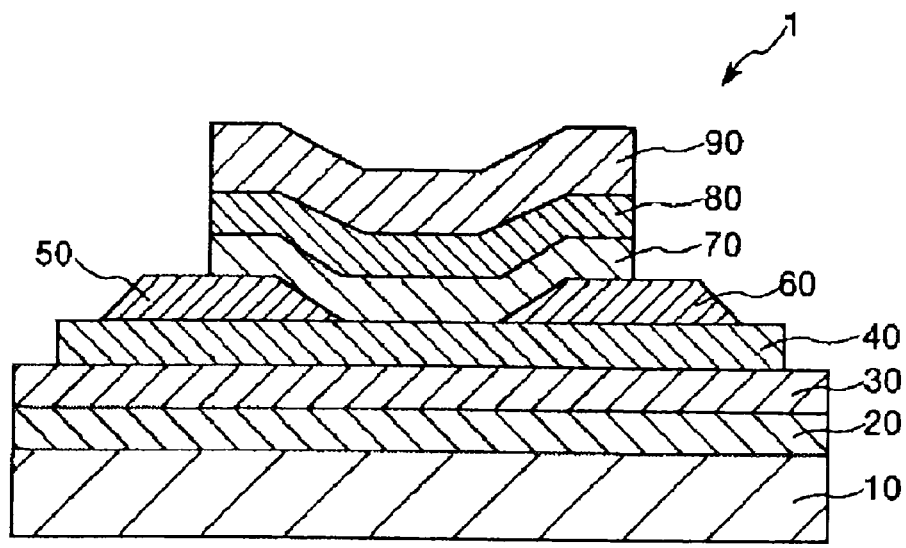
FIG. 4 is a schematic drawing of a transistor according to a second embodiment.

A transistor according to a second embodiment of the invention is now described. FIG. 4 is a schematic drawing of the transistor according to the second embodiment. In the following description of the second embodiment, different features from the transistor according to the first embodiment are mainly described and the descriptions of the identical or similar features will be hereunder omitted.

The transistor according to the second embodiment has the same structure as the first embodiment except for a second interlayer 70. More specifically, the transistor 1 shown in FIG. 4 has the second interlayer 70 between the organic semiconductor layer 40 and the second gate insulating layer 80. Like the first interlayer 30, the second interlayer 70 imparts the ambipolar property to a part of the organic semiconductor layer 40 that contacts with the second interlayer 70 or the upper part of the organic semiconductor layer 40 shown in FIG. 4. Thereby in the organic semiconductor layer 40 shown in FIG. 4, the ambipolar property appears both at the upper part and the lower part of the layer. The transistor 1 having such organic semiconductor layer 40 has a high versatility.

The ambipolar property of the part contacting with the first interlayer 30 (the part facing the first gate insulating layer 20 side) and the ambipolar property of the part contacting with the second interlayer 70 (the part facing the second gate insulating layer 80 side) can be made different each other by setting the different condition in the first interlayer 30 from that in the second interlayer 70. In other words, it is possible to have different carriers in the above-mentioned parts and to adjust the carrier mobility and the threshold voltage by setting the combination of the condition of the first interlayer 30 and the condition of the second interlayer 70. The condition of the interlayers 30, 70 includes constituent material, film thickness, surface condition and the like. Particularly, the constituent material works effectively among these conditions. The ambipolar property in each part can be reliably controlled by setting different constituent materials for the interlayers 30, 70.

Where the organic semiconductor layer 40 is formed of a p-type organic semiconductor material, for example, an n-type semiconductor characteristic can be developed in a part of the organic semiconductor layer 40 by adopting different materials between the interlayer 30 and the interlayer 70. In other words, it is possible to virtually form the n-type semiconductor in a part of the p-type semiconductor. Again the n-type semiconductor has an advantage that its carrier mobility is higher than that of the p-type semiconductor. Therefore it is possible to realize the transistor 1 and a circuit thereof that is capable of a high-speed operation.

As a material for the second interlayer 70, the same materials used for forming the above-described first interlayer 30 can be used. More specifically where the fuluorene-bithiophene copolymer (F8T2) which is a p-type semiconductor is adopted to form the organic semiconductor layer 40, the benzo-cyclo-butene is adopted to form the first interlayer 30 and the octadecyl-trichloro-silane or hexa-methyl-disilazane is adopted to form the second interlayer 70, for example, an n-type semiconductor characteristic is developed in the lower part of the organic semiconductor layer 40 shown in FIG. 4 and a p-type semiconductor characteristic is developed in the upper part of the organic semiconductor layer 40.

According to the embodiment, it is possible to change the transistor properties including the carrier mobility and the threshold voltage in the upper part of the organic semiconductor layer 40 from the original properties. For example, when the octadecyl-trichloro-silane is used to form the second interlayer 70, for example, it is possible to lower the threshold voltage in the upper part of the organic semiconductor layer 40. The same operation and advantageous effects as those of the first embodiment can be obtained for the transistor 1 according to the second embodiment.

Third Embodiment

Figure 5:
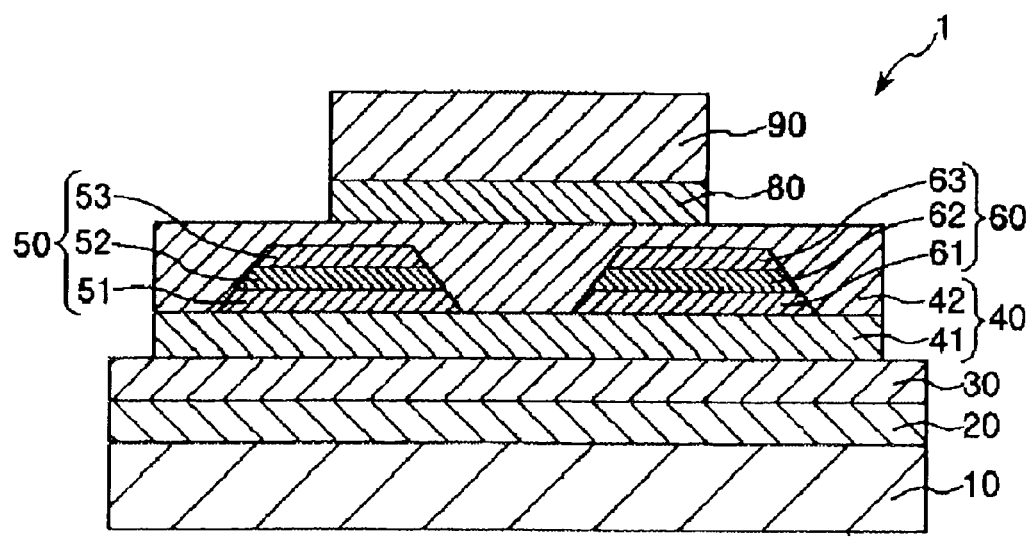
FIG. 5 is a schematic drawing of a transistor according to a third embodiment.

A transistor according to a third embodiment of the invention is now described. FIG. 5 is a schematic drawing of the transistor according to the third embodiment. In the following description of the third embodiment, different features from the transistor according to the first embodiment are mainly described and the descriptions of the identical or similar features will be hereunder omitted. The transistor according to the third embodiment has the same structure as the first embodiment except for the source electrode 50 and the drain electrode 60.

Referring to FIG. 5, the transistor 1 according to the third embodiment includes the source electrode 50 and the drain electrode 60 having a three-layer structure respectively. Because the source electrode 50 and the drain electrode 60 respectively have the layered structure, it is possible to adequately select the material, which has a high carrier injection efficiency, for each layer in the layered structure of the electrodes 50, 60 according to the polarity of the carrier injected in to the organic semiconductor layer 40. Consequently the carrier injection efficiency in the electrodes 50, 60 can be increased and in this way the transistor characteristics can be improved.

The source electrode 50 and the drain electrode 60 are disposed in the organic semiconductor layer 40. In this embodiment, the organic semiconductor layer 40 includes a lower layer 41 and an upper layer 42 that is formed on the lower layer 41. The source electrode 50 and the drain electrode 60 are disposed between the lower layer 41 and the upper layer 42, which means that the electrodes 50, 60 are placed in the organic semiconductor layer 40. The lower layer 41 and the upper layer 42 are formed of the same organic semiconductor material.

In the same way as the first embodiment, the case where fuluorene-bithiophene copolymer (F8T2) which is a p-type semiconductor is adopted to form the organic semiconductor layer 40 and benzo-cyclo-butene which is a n-type semiconductor is adopted to form the first interlayer 30 is described as the third embodiment. In this case the characteristics of the n-type semiconductor appear at the part of the organic semiconductor layer 40 that contacts with the first interlayer 30 or the lower layer 41 shown in FIG. 4. In this way the organic semiconductor layer 40 includes the lower layer 41 where shows the n-type semiconductor characteristics and the upper layer 42 where shows the p-type semiconductor characteristics. The interface between the part showing the n-type semiconductor characteristics and the part showing the p-type semiconductor characteristics is not necessarily identical to the interface between the lower layer 41 and the upper layer 42. For example the interface may be situated either in the lower layer 41 side or in the upper layer 42 side.

Referring to FIG. 5, the source electrode 50 has a multi-layered structure including a first layer 51, a second layer 52 and a third layer 53 that stack sequentially from the bottom.

In this embodiment, among the layers of the multilayered structure, the layer closest to the lower layer 41 in the organic semiconductor layer 40, which is the first layer 51 shown in FIG. 5, is made of a material whose work function is shallower than that of the material forming the other layers or the second layer 52 and the third layer 53 shown in FIG. 5. While the layer closest to the upper layer 42 in the organic semiconductor layer 40, which is the third layer 53 shown in FIG. 5, is made of a material whose work function is deeper than that of the material forming the other layers or the first layer 51 and the second layer 52 shown in FIG. 5. "A deep work function" means that the work function is large and a large energy is needed to extract an electron. "A shallow work function" means the opposite. The material whose work function is deep has a high electron injection efficiency whereas the material whose work function is shallow has a high hole injection efficiency. Referring to FIG. 5, the drain electrode 60 has a multilayered structure including a first layer 61, a second layer 62 and a third layer 63 that stack sequentially from the bottom.

In this embodiment, among the layers of the multilayered structure, the layer closest to the lower layer 41 in the organic semiconductor layer 40, which is the first layer 61 shown in FIG. 5, is made of a material whose work function is shallower than that of the material forming the other layers or the second layer 62 and the third layer 63 shown in FIG. 5. While the layer closest to the upper layer 42 in the organic semiconductor layer 40, which is the third layer 63 shown in FIG. 5, is made of a material whose work function is deeper than that of the material forming the other layers or the first layer 61 and the second layer 62 shown in FIG. 5.

According to the embodiment, the first layer 51 made of the material whose work function is shallower than those of the other layers 52, 53 is situated adjacent to the part where shows the n-type semiconductor characteristics and in which carrier is electron. Thereby electrons can be efficiently injected into the part. In this embodiment, it is possible to inject electrons efficiently into the lower layer 41 of the organic semiconductor layer 40. Furthermore, the third layer 53 made of the material whose work function is deeper than those of the other layers 51, 52 is situated adjacent to the part where shows the p-type semiconductor characteristics and in which carrier is hole. Thereby holes can be efficiently injected into the part. In this embodiment, it is possible to inject holes efficiently into the upper layer 42 of the organic semiconductor layer 40.

As for the constituent materials of the above-described source electrode 50 and the drain electrode 60, where the first layers 51, 61 of the electrodes are made of Ca, it is preferable that the third layers 53, 63 be made of Au. In this way the above-mentioned actions and advantageous effects can be assuredly obtained. In this case, it is further preferable that the second layers 52, 62 be made of Al. Ca is a very active material and can be easily degraded. However when the second layers 52, 62 are made of Al, it is possible to prevent the degradation of Ca.

Though average thicknesses of the source electrode 50 and the drain electrode 60 are not particularly limited, 2-100 nm is preferable and about 5-30 nm is more preferable. By setting the average thickness of the electrodes in this range, it is possible to increase the carrier injection efficiency into the organic semiconductor layer 40 significantly. Consequently it is possible to further improve the transistor characteristics.

The same operation and advantageous effects as those of the first embodiment can be obtained for the transistor 1 according to the above-described third embodiment. The above-described embodiments can also be applied to for example an organic light-emitting transistor (field effect transistor or FET). In this case, after holes and electron are injected into the organic semiconductor layer that has the ambipolar property in the way as the above-described embodiments, recombination which emits light occurs when the holes are coupled with the electrons. With such mechanism, the organic light emitting transistor which works as a light emitting element can be obtained.

To form the organic light emitting transistor, it is generally needed to use an organic semiconductor material with the ambipolar property however its procurement is not easy. According to the invention, it is possible to realize the organic light emitting transistor by using an organic semiconductor material with an unipolar property, which can be easily procured. Therefore there is a wide range of choice for the material used and it is possible to select an organic semiconductor material which has an excellent characteristics. Consequently it is possible to fabricate a low-cost organic light emitting transistor that has fine transistor characteristics and light emitting performance.

Transistor Circuit and Electrooptical Device

Figure 6:
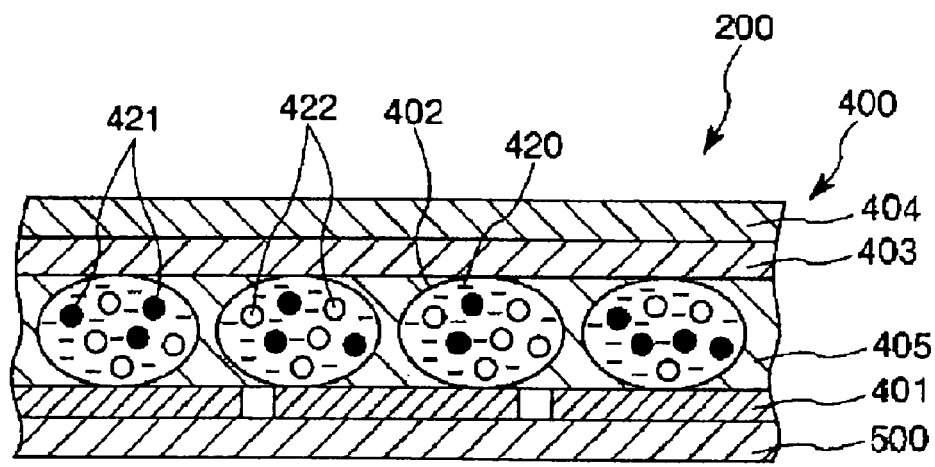
FIG. 6 is a longitudinal sectional view of an electrophoretic display device according to an embodiment.
Figure 7:
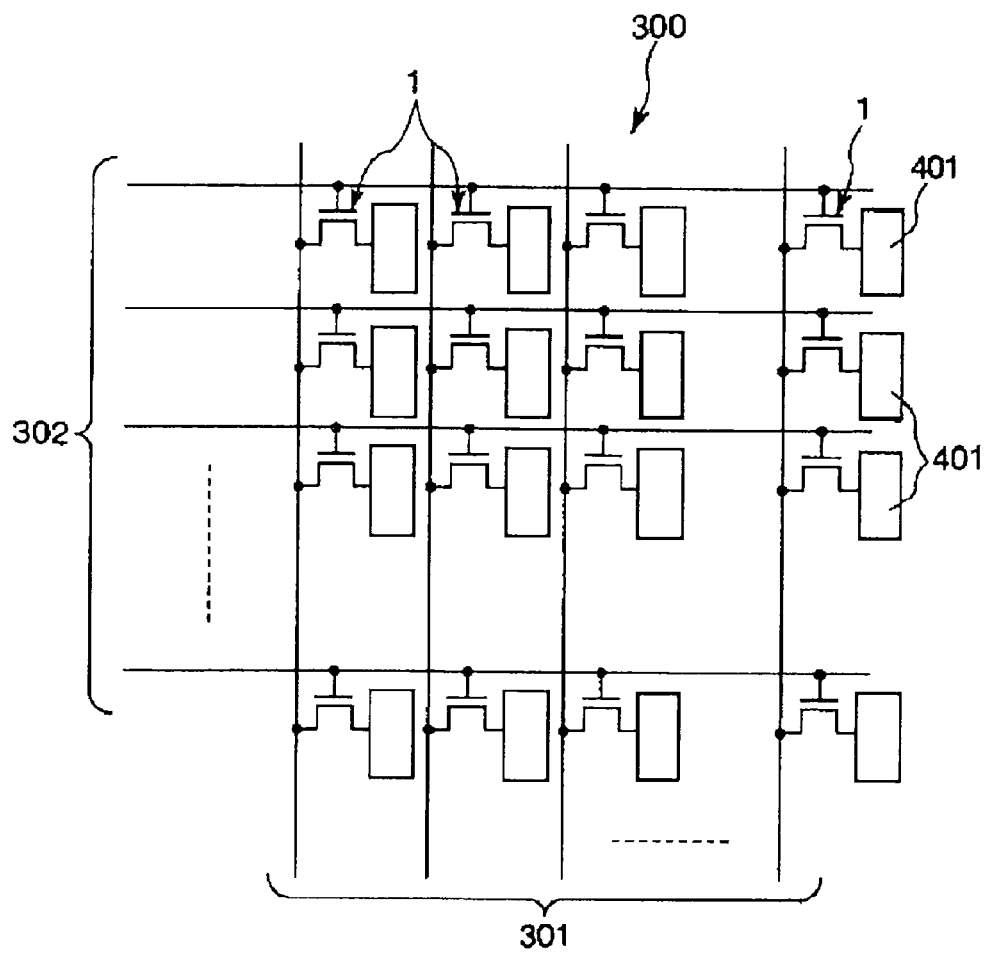
FIG. 7 is a block diagram showing a configuration of an active matrix device which the electrophoretic display device shown in FIG. 6 has.

An electrooptical device having an active matrix device embedded with the above-described transistor 1 (the transistor circuit according to the embodiment of the invention) is now described. An electrophoretic display device is given as an example of the electrooptical device according to the embodiment of the invention. FIG. 6 is a longitudinal sectional view of the electrophoretic display device according to the embodiment of the invention. FIG. 7 is a block diagram showing the configuration of the active matrix device which the electrophoretic display device shown in FIG. 6 has.

Referring to FIG. 6, an electrophoretic display device 200 includes an active matrix device formed on a substrate 500 and an electrophoretic display part 400 that is electrically coupled to the active matrix device. Referring to FIG. 7, the active matrix device 300 includes a data line 301 that orthogonally crosses a scan line 302, the data line 301 and the scan line 302 being provided in the plural number, and a thin film transistor 1 which is provided at each intersection of the data line 301 and the scan line 302. A gate electrode of the thin film transistor 1 is coupled to the scan line 302, the source electrode of the thin film transistor 1 is coupled to the data line 301, and a drain electrode is coupled to a hereunder-described pixel electrode 401 (individual electrode).

Referring to FIG. 6, the electrophoretic display part 400 includes the pixel electrode 401, a microcapsule 402, a transparent electrode 403 (common electrode) and a transparent substrate 404 which are provided so as to form a multilayered structure on the substrate 500. The microcapsule 402 is fixed with a binder 405 between the pixel electrode 401 and the transparent electrode 403.

The pixel electrode 401 is divided in matrix such that each piece is arranged regularly in the vertical and horizontal directions. More than one type of electrophoretic particle having a different characteristic is enclosed in each capsule 402. In this embodiment, dispersion liquid 420 containing two types of electrophoretic particles 421, 422 which respectively have a different color (hue) and a different electric charge each other is enclosed in the capsule. When an select signal (select voltage) is supplied to one or more than one scan line 302 in the electrophoretic display device 200, the thin film transistor 1 coupled to the scan line 302 to which the select signal (select voltage) is supplied is turned ON.

In this way, the data line 301 and the pixel electrode 401 that are coupled to the thin film transistor 1 are substantially made conductive each other. Where a desired data (voltage) is supplied to the data line 301 at this point, the data (voltage) is supplied to the pixel electrode 401, which generates an electric field between the pixel electrode 401 and the transparent electrode 403. The electrophoretic particles 421, 422 are electrophoretically moved toward either the pixel electrode 401 or the transparent electrode 403, which depends on the direction and strength of the electric field, characteristics of the electrophoretic particles 421, 422 and the like.

When the supply of the select signal (select voltage) to the scan line 302 is stopped at this point, the thin film transistor is turned OFF, and the data line 301 and the pixel electrode 401 that are coupled to the thin film transistor 1 are made non-conductive each other. A desired image (information) can be displayed on the display side (the transparent substrate 404 side) of the electrophoretic display device 200 through the above-described operation, more specifically through the combination of supplying or halting the supply of the select signal to the scan line 302 and supplying or halting the supply of the data to the data line 301. Particularly, the electrophoretic display device 200 according to the embodiment has the electrophoretic particles 421, 422 whose colors are different each other so that it is possible to display an image in multiple tones.

Furthermore, the electrophoretic display device 200 according to the embodiment has the active matrix device 300 thereby the thin film transistor 1 coupled to the desired scan line 302 can be selectively and securely turned ON/OFF, which reduces the occurrence of a crosstalk problem and increase the speed of the circuit operation. Consequently a high quality image (information) can be obtained. Moreover the electrophoretic display device 200 according to the embodiment operates with a low driving voltage so that it is possible to save the electric power.

The electrooptical device in which the active matrix device having the above-described thin film transistor is embedded can also be applied to other devices such as display devices including a liquid crystal device, an organic or inorganic electroluminescence (EL) device and the like, light emitting devices and the like in addition to the above-described electrophoretic display device 200. Though the above-described transistor has the two gate electrodes, the transistor according to the embodiment may have three or more gate electrodes.

Electronic Apparatus

The electrophoretic display device 200 can be embedded in various electronic apparatuses. An electronic apparatuses having the electrophoretic display device 200 are now described.

I. Electronic Paper

Figure 8:
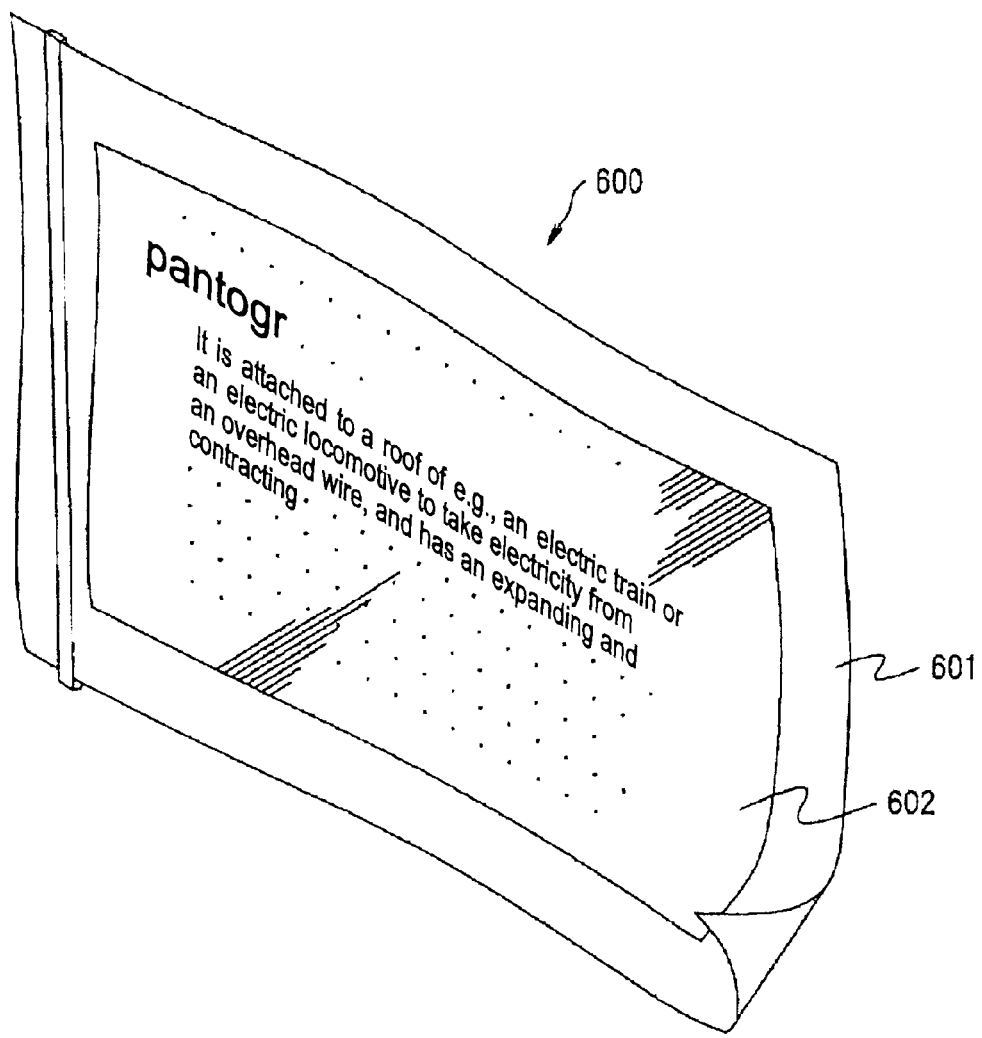
FIG. 8 is a perspective view of an electronic paper which is an embodiment of an electronic apparatus according to the invention for showing its structure.

An embodiment in which the electronic apparatus according to the invention is applied to an electronic paper is described. FIG. 8 is a perspective view of the electronic paper which is the embodiment of the electronic apparatus for showing its structure. An electronic paper 600 has a main body 601 made from a rewritable sheet which has a texture like paper and flexibility, and a display unit 602. In the electronic paper 600 according to the embodiment, the electrophoretic display device 200 is adopted as the display unit 602.

II. Display

Figure 9A:
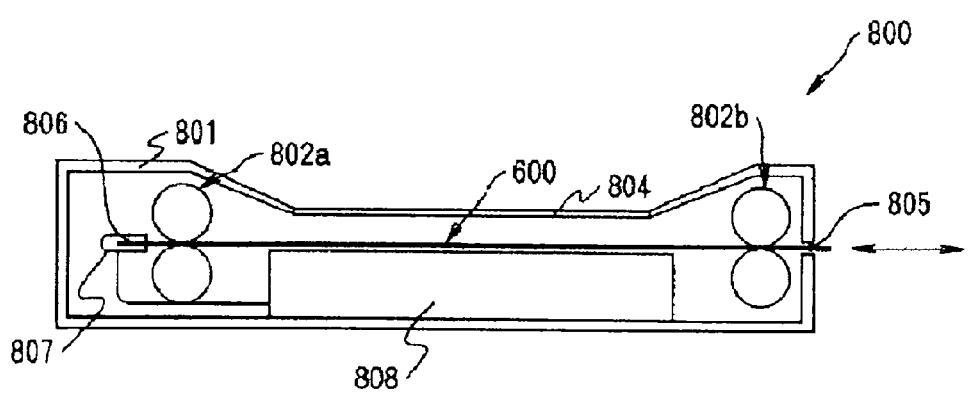
FIG. 9 shows an embodiment in which the electronic apparatus according to the invention is applied to a display.
Figure 9B:
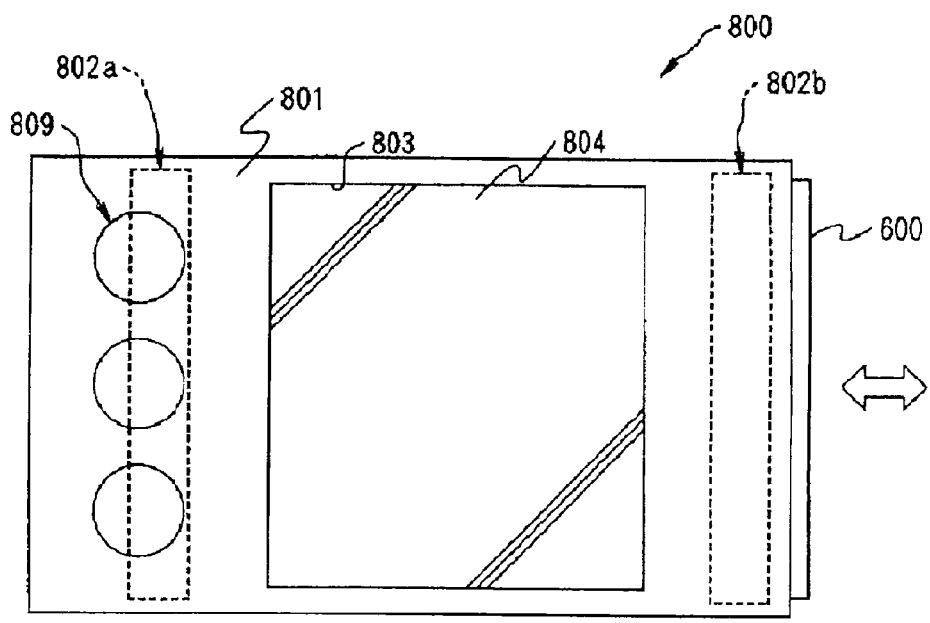

Next, an embodiment in which the electronic apparatus according to the invention is applied to a display is described. FIG. 9 shows the embodiment in which the electronic apparatus according to the invention is applied to a display. FIG. 9A is a sectional view of the display and FIG. 9B is a plan view of the display. A display 800 shown in FIG. 9 includes a main body 801 and the electronic paper 600 disposed such that it can be attached and removed to/from the main body 801. The electronic paper 600 has the above-described structure or the same structure as shown in FIG. 8.

An insertion slot 805 through which the electronic paper 600 can be inserted is formed on a side face (right side in FIG. 9) of the main body 801. Two pairs of carrier rollers 802a, 802b are also provided inside the main body 801. When the electronic paper 600 is inserted into the main body 801 through the insertion slot 805, the electronic paper 600 is disposed between the carrier rollers 802a, 802b and placed in the main body 801.

A rectangular opening 803 is formed on a display side (the front side in the page of FIG. 9B) of the main body 801, and a transparent glass substrate 804 is embedded in the opening 803. With such structure, the electronic paper 600 that is situated in the main body 801 is visible from the outside of the main body 801. In other words, the display 800 has a display plane in which the electronic paper 600 placed in the main body 801 is seen through the transparent glass substrate 804.

A terminal 806 is provided on a fore-end of the electronic paper 600 in the insertion direction (left side in FIG. 9). A socket 807, to which the terminal 806 is coupled when the electronic paper 600 is placed in the main body 801, is provided inside the main body 801. A controller 808 and an operating part 809 are electrically coupled to the socket 807. In such display 800, the electronic paper 600 is disposed such that it is detachable from the main body 801, and it can be used as being detached from the main body. In the display 800 according to the embodiment, the electrophoretic display device 200 is adopted as the electronic paper 600.

The electric apparatus according to the invention is not limited to the above-described embodiments. It can be also applied to for example television, a view-finder type or direct-view type video tape recorder, a car navigation device, a pager, an electronic databook, a calculator, an electronic newspaper, a word processor, a personal computer, a work station, a videophone, a point-of-sale terminal, equipments having a touch panel or the like. The electrophoretic display device 200 can be adopted as a display part of these electronic apparatuses.

Though the transistor, transistor circuit, electrooptical device and electronic apparatus have been described as the embodiments, the present invention is obviously not limited to the specific embodiments described herein, but also encompasses any variations that may be considered by any person skilled in the art, within the general scope of the invention. Note that the constructions of the transistor, transistor circuit, electrooptical device and electronic apparatus of the invention can be replaced by the constructions that serve the equivalent function and exert the equivalent effect. The invention also encompasses the structure in which a hitherto know art is added to the structure described in the above embodiments. The invention also encompasses any combination of the above-described embodiments.

What is claimed is:

1. A transistor, comprising:
   a first gate electrode;
   a second gate electrode;
   a first gate insulating layer disposed between the first gate electrode and the second gate electrode;
   a first interlayer disposed between the first gate insulating layer and the second gate electrode and containing a first organic material;
   an organic semiconductor layer disposed between the first interlayer and the second gate electrode;
   a second interlayer disposed between the organic semiconductor layer and the second gate electrode and containing a second organic material;

a second gate insulating layer disposed between the second interlayer and the second gate electrode; and a source electrode and a drain electrode disposed between the first interlayer and the second interlayer and injecting carriers into the organic semiconductor layer, an ambipolar property being imparted to only a part of the organic semiconductor layer that contacts with the first interlayer and the second interlayer under an action of the first interlayer and a second interlayer.

2. The transistor according to claim 1, the first interlayer and the second interlayer differing in condition.

3. The transistor according to claim 1, the first interlayer being made of a different material from a material forming the second interlayer.

4. The transistor according to claim 1, an average thickness of the first interlayer and the second interlayer being respectively in a range of 5 to 200 nm.

5. The transistor according to claim 1, the first organic material at least including one selected from the group including benzo-cyclo-butene (BCB), octadecyl-trichloro-silane (OTS) and hexa-methyl-disilazane (HMDS).

6. The transistor according to claim 1, a part of the organic semiconductor layer that contacts with the first gate insulating layer side differing from a part of the organic semiconductor layer that contacts with the second gate insulating layer side in carrier polarity.

7. The transistor according to claim 1, the source electrode and the drain electrode being disposed in the organic semiconductor layer and have a multilayered structure respectively.

8. The transistor according to claim 7, a layer of the multilayered structure that is situated closest to a part of the organic semiconductor layer where carrier polarity is positive being made of a material whose work function is deeper than materials forming other layers of the multilayered structure.

9. The transistor according to claim 7, a layer of the multilayered structure that is situated closest to a part of the organic semiconductor layer where carrier polarity is negative being made of a material whose work function is shallower than materials forming other layers of the multilayered structure.

10. The transistor according to claim 1, the organic semiconductor layer being formed of a conjugate system high-molecule material.

11. A transistor circuit comprising the transistor according to claim 1.

12. An electrooptical device comprising the transistor circuit according to claim 11.

13. An electronic apparatus comprising the electrooptical device according to claim 12.

* * * * *